Aug. 8, 1972 NOBORU ICHINOSE ET AL 3,682,826

OXIDE PIEZOELECTRIC MATERIALS

Filed March 29, 1971 5 Sheets-Sheet 3

Aug. 8, 1972 NOBORU ICHINOSE ET AL 3,682,826

OXIDE PIEZOELECTRIC MATERIALS

Filed March 29, 1971 5 Sheets-Sheet 4

United States Patent Office 3,682,826

Patented Aug. 8, 1972

3,682,826

OXIDE PIEZOELECTRIC MATERIALS

Noboru Ichinose, Harutoshi Egami, Katsunori Yokoyama, and Yohachi Yamashita, Yokohama, Japan, assignors to Tokyo Shibaura Electric Co., Ltd., Kawasaki-shi, Japan Filed Mar. 29, 1971, Ser. No. 129,105
Claims priority, application Japan, Apr. 1, 1970, 45/26,966
Int. Cl. C04b *46/48*
U.S. Cl. 252—62.9 1 Claim

ABSTRACT OF THE DISCLOSURE

Ternary oxide piezoelectric materials consisting of 0.5 to 50.0 mol percent of $Pb(Me_{1/2}Te_{1/2})O_3$, 35.0 to 57.0 mol percent $PbTiO_3$ and 15.0 to 55.0 mol percent of $PbZrO_3$ (where Me denotes at least one metal of the group of magnesium and zinc).

This invention relates to oxide piezoelectric materials and more particularly to the oxide piezoelectric materials which consist of ternary oxides of $Pb(Me_{1/2}Te_{1/2})O_3$–$PbTiO_3$–$PbZrO_3$ (where Me represents at least one metal selected from the group consisting of magnesium and zinc) prepared by solid phase reaction from a plurality of oxides having different valences and are well adapted for use as electro-acoustic-mechanical transducer elements due to stable high piezoelectric properties.

As is well known, piezoelectric materials are widely used as an oscillator element for generating supersonic waves, an element for ceramic filters, pickups, microphones, vibrators, etc. and also an ignition element for gas appliances. For such applications, there has been developed an improved form of binary oxide piezoelectric material $PbTiO_3$–$PbZrO_3$ (mixed in a substantially equal molar ratio). There have been attempts to elevate the piezoelectric properties of said binary composition by adding, for example, CdO or ZnO. In this case, however, the electro-mechanical coupling coefficient $K_p$ of the resultant product only indicates a value of 37 to 48%. Further, the aforementioned piezoelectric compositions are found to have the drawback that the piezoelectric properties vary with time and temperature. There has also been proposed a ternary piezoelectric material of $PbTiO_3$–$PbZrO_3$–$Pb(Mg_{1/3}Nb_{2/3})O_3$. However, this composition generally has an electro-mechanical coupling coefficient of about 50% at most and a mechanical quality factor $Q_M$ of 600 max. (With a piezoelectric material whose mechanical quality factor $Q_M$ is 568, the $K_p$ stands at 7.5%.) In practical application, however, a piezoelectric composition of this type should have as high an electro-mechanical coupling coefficient $K_p$ and mechanical quality factor $Q_M$ as possible.

With the aforementioned type of piezoelectric material, application of a great mechanical pressure across the positive and negative poles after polarization results in the generation of a high voltage therein. Accordingly, the material can be put to various applications including the generation of spark discharges across the poles using said voltage.

The properties of piezoelectric materials adapted for these applications are evaluated by various constants generally associated therewith, for example, an electro-mechanical coupling coefficient and output voltage coefficient. Where, however, there is applied a high mechanical pressure, there generally results the decrease of output voltage (accompanied with loss of the electro-mechanical coupling coefficient $K_{33}$), which raises a great problem. Therefore, it is necessary to consider the control of reduction in said voltage in addition to the aforementioned constants. In view of such situation, this invention is intended to provide very stable piezoelectric materials which are minimally subject to the aforesaid quality deterioration. This deterioration occurs with respect to not only the mechanical pressure characteristics but also the electrical properties of elements used in supersonic devices and piezoelectric transformers.

An object of this invention is to provide very stable piezoelectric materials which are minimally subject to the deterioration of a piezoelectric effect and can continuously generate as high a voltage as desired, even though it may be operated at a pressure of 100 to 2000 kg./cm.$^2$.

Another object of the invention is to provide piezoelectric materials adapted to generate spark discharges for ignition of gas and small capacity engines.

According to an aspect of the invention, there are provided piezoelectric materials consisting of 0.5 to 50.0 mol percent $Pb(Me_{1/2}Te_{1/2})O_3$ (where Me is at least one metal selected from the group consisting of magnesium and zinc), 35.0 to 57.0 mol percent $PbTiO_3$ and 15.0 to 55.0% $PbZrO_3$.

This invention can be more fully understood from the following detailed description when taken in conjunction with reference to the appended drawings, in which.

Figure 4:
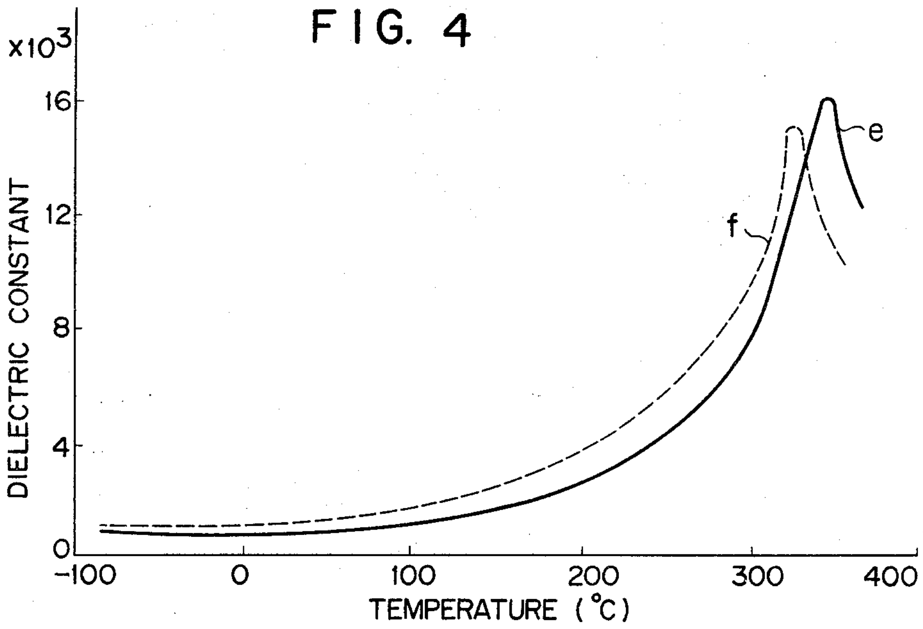
FIG. 4 is a curve diagram illustrating the temperature characteristics of the dielectric constant of two kinds of piezoelectric material.
Figure 5:
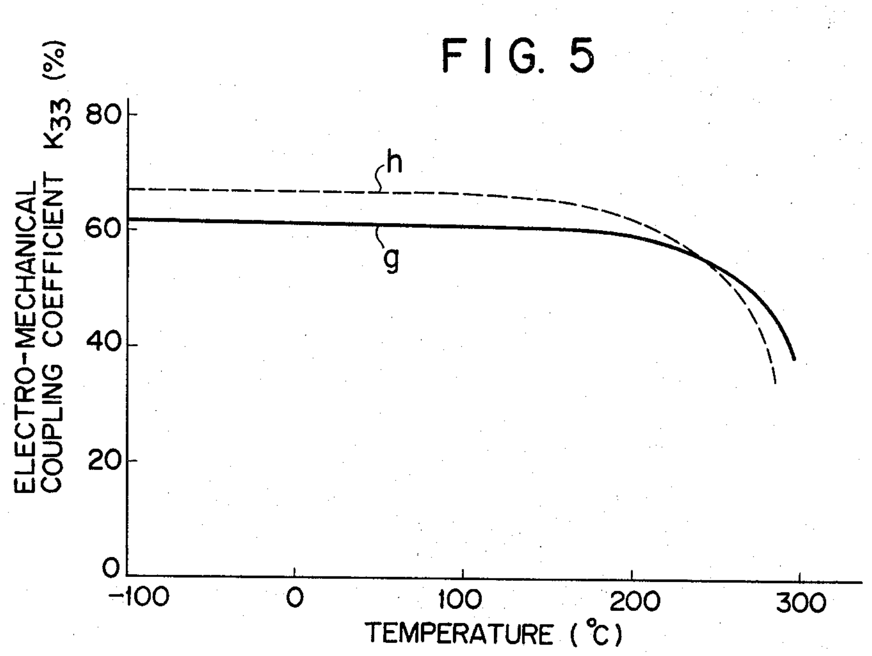
Figure 6:
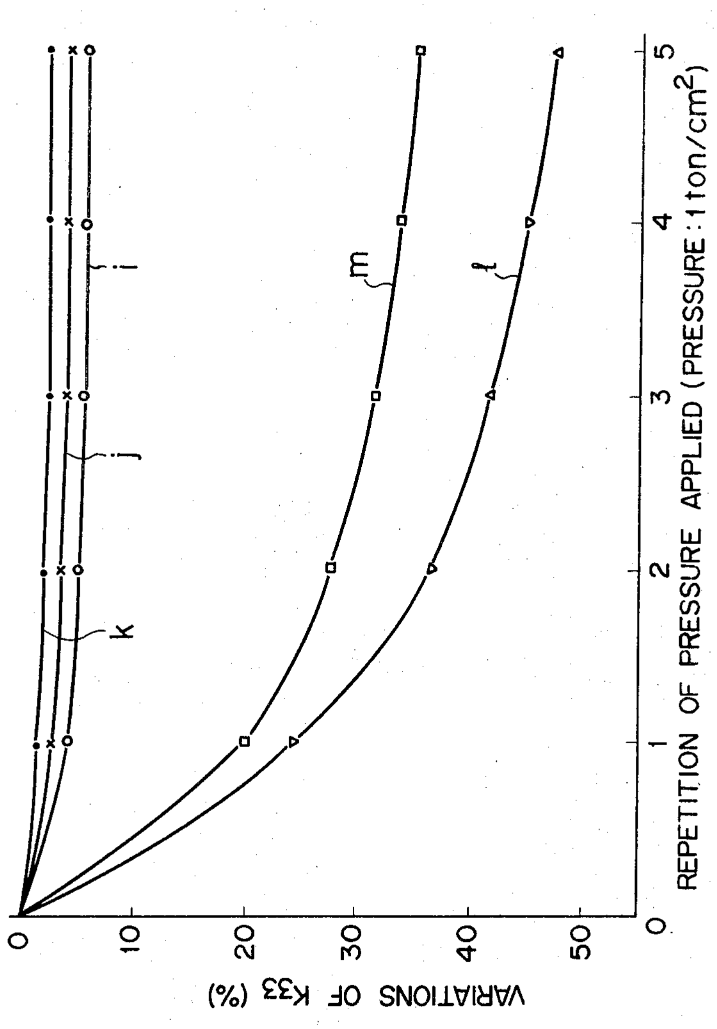

FIG. 5 is a curve diagram showing the temperature characteristics of the electro-mechanical coupling coefficient $K_{33}$ of said two piezoelectric materials of FIG. 4; and FIG. 6 is a curve diagram illustrating variations in the electro-mechanical coupling coefficient $K_{33}$ with respect to the frequency of stressing pressure applied, as compared between three samples of this invention and two reference samples of the prior art.

This invention will now be described by reference to the appended drawings. The oxide piezoelectric material of the invention is prepared by solid phase reaction of a plurality of oxides having different valences. Namely, said material consists of a ternary system having a pervoskite structure, that is, $Pb(Me_{1/2}Te_{1/2})O_3$ (where Me denotes at least one of the group of magnesium and zinc, hereinafter simply referred to as Me:Mg, Zn)–$PbTiO_3$–$PbZrO_3$ obtained by substituting part of a binary system $PbTiO_3$–$PbZrO_3$ with $Pb(Me_{1/2}Te_{1/2})O_3$.

The oxide piezoelectric material of this invention is characterized in that it consists of 0.5 to 50.0 mol percent $Pb(Me_{1/2}Te_{1/2})O_3$, 35.0 to 57.0 mol percent $PbTiO_3$ and 15.0 to 55.0 mol percent $PbZrO_3$ (the proportions of the three components are so chosen as to total 100 mol).

The oxide piezoelectric material of the invention can generally be easily prepared by the technique of powder metallurgy. That is, raw oxides such as PbO, $TiO_2$, $ZrO_2$, $TeO_3$ and MeO(Me:Mg, Zn) are accurately weighed out in a desired ratio and thoroughly mixed, for example, in a ball mill. The raw materials may also consist of compounds convertible to oxides upon heating, such as hydroxides, carbonates and oxalates. The mixture is preheated to 600 to 900° C., and then pulverized to powders so controlled as to have a particle size of 1 to 2 microns. To said controlled powders is added a binding agent such as water or polyvinyl alcohol. After molded at a pressure of 0.5 to 2 ton/cm.², the mass is baked at a temperature of about 1000 to 1270° C. Since part of PbO, one component of the piezoelectric composition, is likely to be evaporated off during said baking, the operation is conducted in a closed furnace. The oxide mixture is generally only required to be kept at a maximum temperature for about 0.5 to 3 hours. On both sides of the mixtures thus molded and sintered are mounted a pair of electrodes. The mass is polarized by impressing the electrodes with a DC voltage of the field strength of 20 to 30 kv./cm. for about an hour in silicone oil at a temperature of 140° to 160° C.

It is for the following reason that the proportions of $Pb(Me_{1/2}Te_{1/2})O_3$ (Me:Mg, Zn), $PbTiO_3$ and $PbZrO_3$ constituting the oxide piezoelectric composition of this invention are limited as described above. Where the amount of $Pb(Me_{1/2}Te_{1/2})O_3$ increases over 50.0 mol percent, there will not be obtained a piezoelectric material for ignition having a desired 50% electro-mechanical coupling coefficient $K_{33}$. When determination was made of the electro-mechanical coupling coefficient $K_{33}$ of an oxide piezoelectric material by changing the proportions of $$Pb(Me_{1/2}Te_{1/2})O_3$$

Figure 1:
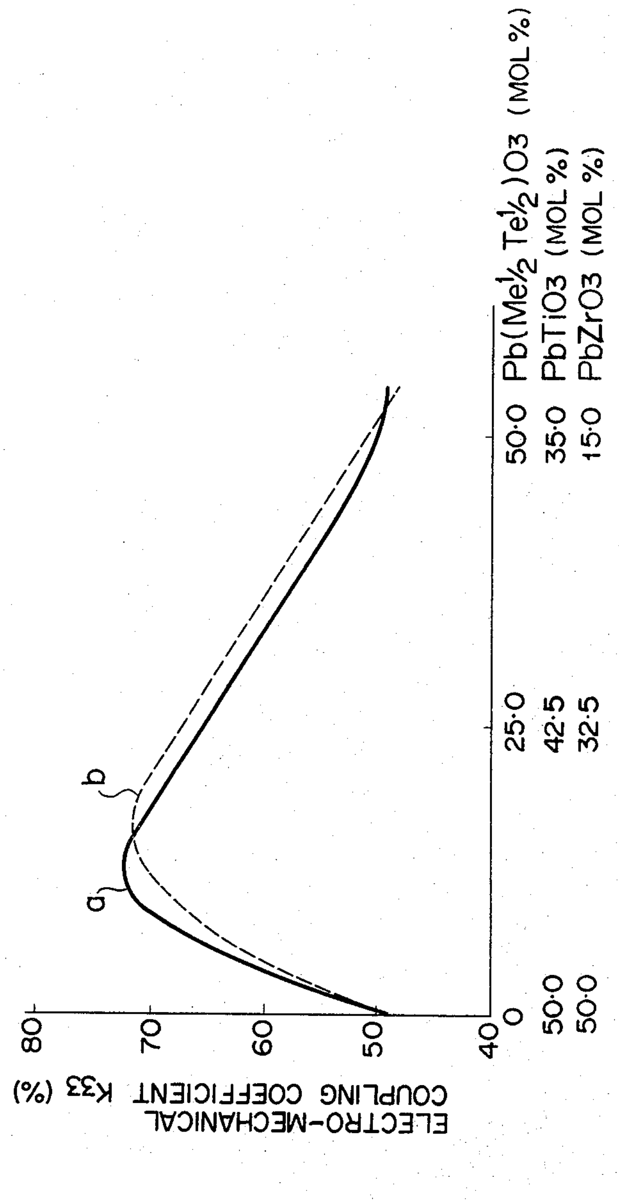
FIG. 1 is a curve diagram showing variations in the electro-mechanical coupling coefficient $K_{33}$ where there are changed the proportions of two components of ternary piezoelectric materials.

(Me:Mg, Zn), $PbTiO_3$ and $PbZrO_3$, there was presented the tendency of FIG. 1. Where the content of $$Pb(Me_{1/2}Te_{1/2})O_3$$

(Me:Mg, Zn) fell off the range of 0.5 to 50.0 mol percent, there was not obtained in any case a product having desired piezoelectric properties. Referring to FIG. 1, the curve (a) represents the case where Me was magnesium and the curve (b) denotes the case where Me was zinc.

Figure 2:
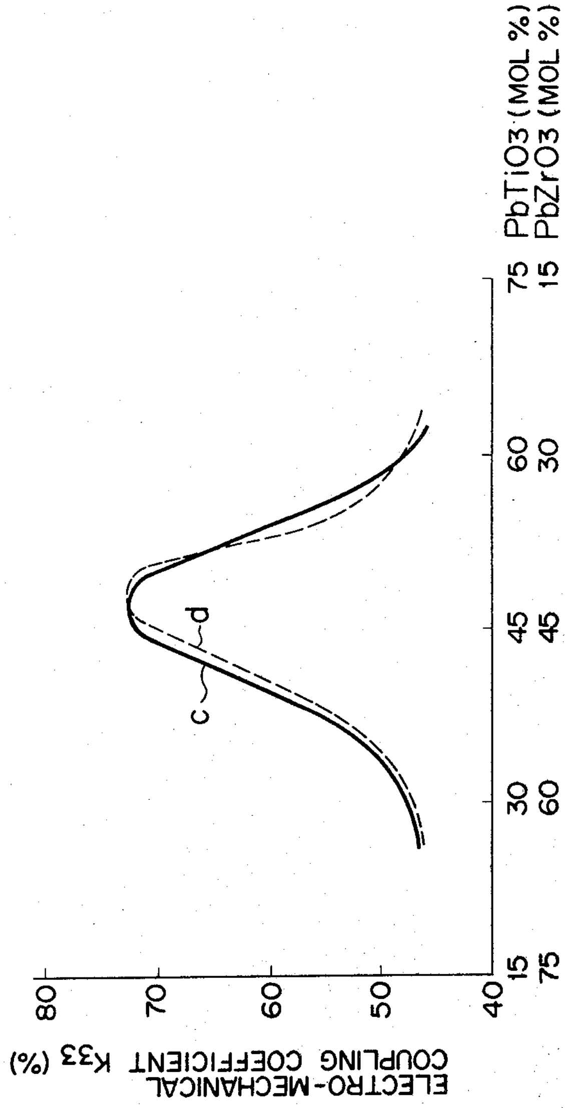
FIG. 2 is a curve diagram indicating variations in the electro-mechanical coupling coefficient $K_{33}$ where there are changed the proportions of $PbTiO_3$ and $PbZrO_3$ with the amount of $Pb(Me_{1/2}Te_{1/2})O_3$ (where Me represents magnesium and zinc) fixed.
Figure 3:
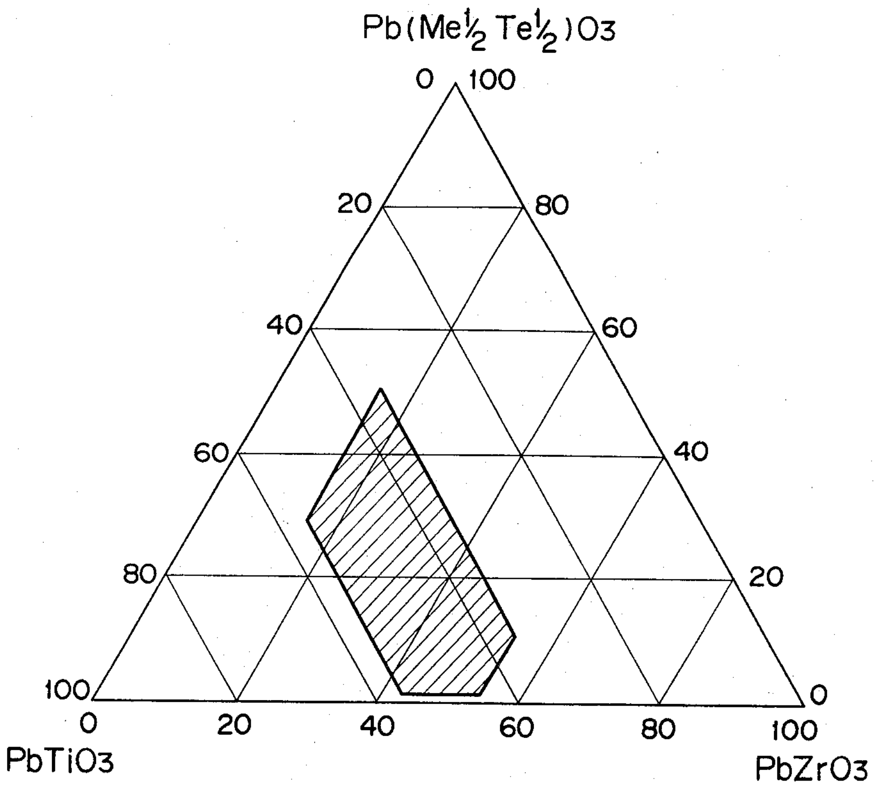
FIG. 3 is a triangular chart presenting the specified range of basic ternary piezoelectric compositions.

The reason why the content of $PbTiO_3$ should be defined within the range of 35.0 to 57.0 mol percent is that if said content falls to below 35 mol percent or rises above 57.0 mol perecnt, then there will not be obtained in either case a product having a large electro-mechanical coupling coefficient. For example, when a determination was made of the properties of oxide piezoelectric materials containing various proportions of $PbTiO_3$ with the amount of $Pb(Me_{1/2}Te_{1/2})O_3$ (Me:Mg, Zn) fixed at 10.0 mol percent there was presented the tendency of FIG. 2, in which the curve (c) represents the case of Me:magnesium and the curve (d) the case of Me:zinc. As apparent from FIGS. 1 and 2, a smaller proportion of $PbTiO_3$ than 35 mol percent fails to enable the resulting product to display desired piezoelectric properties. Conversely, a larger amount thereof than 57.0 mol percent similarly fails to give desired piezoelectric properties, or even if a problem with respect to said properties, is not raised a product which is quite satisfactory in respect of the stability of said properties is not obtained. Accordingly, the proportion of $PbTiO_3$ should always be defined within the aforementioned range. On the other hand, the amount of $PbZrO_3$, another component of the basic ternary composition $Pb(Me_{1/2}Te_{1/2})O_3$–$PbTiO_3$–$PbZrO_3$ is always selected from the range of 15.0 to 55.0 mol percent so as to obtain a product having desired properties. In short, the proportions of the aforesaid three components are chosen from the region indicated in hatching in the triangular chart of FIG. 3. Further, $Pb(Me_{1/2}Te_{1/2})O_3$ (Me:Mg, Zn) acts as a mineralizer to facilitate sintering, which in turn eventually reduces sintering temperature to suppress the evaporation of PbO constituting part of the piezoelectric composition, thereby finally producing a compact piezoelectric material.

As mentioned above, the oxide piezoelectric material of this invention mainly consists of a uniform solid solution of PbO, $TiO_2$, $ZrO_2$, $TeO_3$ and MeO having the so-called perovskite structure (as confirmed by X-ray analysis). While the composition is expressed by a general formula $ABO_3$, it may be deemed to consist of a plurality of elements having different valences wherein A represents divalent Pb, and B denotes divalent Me, hexavalent Te and tetravalent Ti and Zr. In this respect, the abovementitoned combination of elements constituting the piezoelectric composition of this invention is essentially different from the prior art composition mainly formed of octahedral oxygen wherein, if the latter composition is expresed by a general formula $A'B'O_3$, A' represents divalent elements and B' tetravalent elements or A' denotes monovalent elements and B' pentavalent elements, that is, A' and B' respectively consist of a combination of elements having the same valence. As described above, the oxide piezoelectric material of this invention is fundamentally different from the conventional type in respect of composition, presenting execellent piezoelectric properties minimally subject to change with time and temperature, and always displaying a desired performance.

A study of variations in the voltage generated upon impingement by a piezoelectric material used as an ignition element, it was found that the prior art product indicated 15% decrease in the generated voltage when it was impinged a million times, whereas the product of this invention only presented 5% voltage drop under the same condition. Since reduction in the generated voltage as observed in the above-mentioned durability test of the ignition element eventually decreases the reliability of ignition, the piezoelectric material of this invention can be considered materially more advantageous.

The present invention will be more fully understood from the examples which follow.

There were accurately weighed out PbO, $TiO_2$, $ZrO_2$, $TeO_3$ and MeO(Me:Mg, Zn) to form a basic ternary piezoelectric composition in a desired ratio, that is, 0 to 52 mol percent $Pb(Me_{1/2}Te_{1/2})O_3$, 34 to 60 mol percent $PbTiO_3$ and 14 to 57 mol percent $PbZrO_3$. These oxides were mixed in a ball mill. The mixture was prebaked at a temperature of 850° C. and then pulverized in a ball mill to obtain 67 kinds of powders controlled in particle size including reference samples. To said powders was added polyvinyl alcohol as a binding agent. The mass was molded at a pressure of 1 ton/cm.² and kept one hour at a temperature of 1000° to 1280° C. for sintering, obtaining disk samples each 1 mm. thick and 13 mm. in diameter and columnar samples each 7 mm. in diameter and 15 mm. long.

Determination was made of the specific gravity of the disk and columnar samples thus prepared. Said samples were fitted with electrodes across which there was impressed a DC voltage of the field strength of 30 kv./cm. for one hour in silicone oil at a temperature of 140° C. for polarization. The piezolectric properties of said samples were determined according to the standard procedure set forth in Proc. IRE, vol. 137, p. 1378 to p. 1395 (1949). The test results are presented in Table 1 below together with the compositions of said samples. Referring to said table, the characters F. T. represent baking temperature (° C.), D the specific gravity at 23° C., $\epsilon$ a dielectric constant (measured at 1 kilo Hz. and 23° C.), and $K_{33}$ an electro-mechanical coupling coefficient (%). In said table there is also given the deterioration of $K_{33}$ when each sample was impinged a million times.

TABLE 1

| Sample | $PbTiO_3$ | $PbZrO_3$ | $Pb(Me_{1/3}Te_{1/3})O_3$ | F.T. | D | ε | $K_{33}$ | Deterioration percent |
|---|---|---|---|---|---|---|---|---|
| Reference: | | | | | | | | |
| 1 | 60.0 | 40.0 | 0 | 1,280 | 7.41 | 853 | 40.6 | 20.8 |
| 2 | 60.0 | 30.0 | Me:Mg, 10.0 | 1,260 | 7.49 | 907 | 45.8 | 11.3 |
| 3 | 60.0 | 30.0 | Me:Zn, 10.0 | 1,260 | 7.50 | 956 | 47.2 | 10.7 |
| 4 | 60.0 | 20.0 | Me:Mg, 20.0 | 1,240 | 7.48 | 784 | 44.8 | 12.6 |
| 5 | 60.0 | 20.0 | Me:Zn, 20.0 | 1,240 | 7.45 | 805 | 43.8 | 10.2 |
| Example: | | | | | | | | |
| 1 | 57.0 | 42.5 | Me:Mg, 0.5 | 1,270 | 7.50 | 950 | 50.3 | 4.2 |
| 2 | 57.0 | 42.5 | Me:Zn, 0.5 | 1,270 | 7.53 | 1,003 | 51.0 | 4.6 |
| 3 | 57.0 | 37.0 | Me:Mg, 6.0 | 1,250 | 7.56 | 1,102 | 59.5 | 3.3 |
| 4 | 57.0 | 37.0 | Me:Zn, 6.0 | 1,250 | 7.54 | 1,087 | 58.6 | 2.9 |
| 5 | 57.0 | 30.0 | Me:Mg, 13.0 | 1,230 | 7.60 | 1,221 | 62.2 | 5.1 |
| 6 | 57.0 | 30.0 | Me:Zn, 13.0 | 1,230 | 7.61 | 1,202 | 60.1 | 4.9 |
| 7 | 57.0 | 20.0 | Me:Mg,23.0 | 1,210 | 7.58 | 1,144 | 55.8 | 3.8 |
| 8 | 57.0 | 20.0 | Me:Zn, 23.0 | 1,210 | 7.57 | 1,098 | 54.5 | 4.0 |
| 9 | 57.0 | 15.0 | Me:Mg, 28.0 | 1,190 | 7.53 | 991 | 51.6 | 2.6 |
| 10 | 57.0 | 15.0 | Me:Zn, 28.0 | 1,190 | 7.51 | 976 | 51.8 | 2.5 |
| 11 | 50.0 | 49.5 | Me:Mg, 0.5 | 1,240 | 7.57 | 943 | 52.1 | 4.3 |
| 12 | 50.0 | 49.5 | Me:Zn, 0.5 | 1,240 | 7.55 | 958 | 51.7 | 4.7 |
| 13 | 50.0 | 44.0 | Me:Mg, 6.0 | 1,220 | 7.62 | 1,083 | 60.5 | 5.0 |
| 14 | 50.0 | 44.0 | Me:Zn, 6.0 | 1,220 | 7.65 | 1,146 | 61.4 | 4.4 |
| 15 | 50.0 | 37.0 | Me:Mg, 13.0 | 1,200 | 7.68 | 1,251 | 70.5 | 3.9 |
| 16 | 50.0 | 37.0 | Me:Zn, 13.0 | 1,200 | 7.64 | 1,238 | 70.0 | 4.2 |
| 17 | 50.0 | 37.0 | Me:Mg, 6.0; Me: Zn, 7.0; | 1,200 | 7.70 | 1,270 | 71.2 | 4.5 |
| 18 | 50.0 | 27.0 | Me:Mg, 23.0 | 1,180 | 7.62 | 1,143 | 63.5 | 3.3 |
| 19 | 50.0 | 27.0 | Me:Zn, 23.0 | 1,180 | 7.63 | 1,185 | 64.0 | 3.7 |
| 20 | 50.0 | 27.0 | Me:Mg, 30.0 | 1,160 | 7.60 | 1,101 | 60.8 | 4.2 |
| 21 | 50.0 | 27.0 | Me:Zn, 30.0 | 1,160 | 7.61 | 1,125 | 60.1 | 3.8 |
| 22 | 50.0 | 15.0 | Me:Mg, 35.0 | 1,130 | 7.55 | 1,086 | 52.4 | 2.2 |
| 23 | 50.0 | 15.0 | Me:Zn, 35.0 | 1,130 | 7.54 | 1,053 | 51.8 | 2.8 |
| 24 | 50.0 | 15.0 | Me:Mg, 20.0, Me:Zn, 15.0. | 1,130 | 7.56 | 1,100 | 52.8 | 3.0 |
| 25 | 45.0 | 54.5 | Me:Mg, 0.5 | 1,220 | 7.58 | 974 | 51.1 | 1.8 |
| 26 | 45.0 | 54.5 | Me:Zn, 0.5 | 1,220 | 7.57 | 983 | 52.0 | 2.0 |
| 27 | 45.0 | 49.0 | Me:Mg, 6.0 | 1,200 | 7.62 | 1,112 | 61.7 | 2.7 |
| 28 | 45.0 | 49.0 | Me:Zn, 6.0 | 1,200 | 7.61 | 1,101 | 60.8 | 2.1 |
| 29 | 45.0 | 44.0 | Me:Mg, 11.0 | 1,180 | 7.70 | 1,340 | 73.5 | 3.6 |
| 30 | 45.0 | 44.0 | Me:Zn, 11.0 | 1,180 | 7.72 | 1,306 | 71.8 | 4.0 |
| 31 | 45.0 | 37.0 | Me:Mg, 18.0 | 1,150 | 7.66 | 1,215 | 67.7 | 3.5 |
| 32 | 45.0 | 37.0 | Me:Zn, 18.0 | 1,150 | 7.62 | 1,204 | 68.5 | 3.2 |
| 33 | 45.0 | 30.0 | Me:Mg, 25.0 | 1,130 | 7.60 | 1,147 | 62.1 | 2.6 |
| 34 | 45.0 | 30.0 | Me:Zn, 25.0 | 1,130 | 7.59 | 1,102 | 62.5 | 2.5 |
| 35 | 45.0 | 20.0 | Me:Mg, 35.0 | 1,100 | 7.53 | 1,018 | 59.3 | 1.7 |
| 36 | 45.0 | 20.0 | Me:Zn, 35.0 | 1,100 | 7.54 | 1,006 | 59.8 | 2.0 |
| 37 | 45.0 | 15.0 | Me:Mg, 40.0 | 1,080 | 7.51 | 924 | 52.7 | 1.5 |
| 38 | 45.0 | 15.0 | Me:Zn, 40.0 | 1,080 | 7.50 | 908 | 51.4 | 2.1 |
| 39 | 40.0 | 55.0 | Me:Mg, 5.0 | 1,200 | 7.53 | 886 | 52.6 | 1.9 |
| 40 | 40.0 | 55.0 | Me:Zn, 5.0 | 1,200 | 7.56 | 912 | 53.3 | 2.4 |
| 41 | 40.0 | 45.0 | Me:Mg, 15.0 | 1,160 | 7.60 | 1,041 | 61.1 | 2.8 |
| 42 | 40.0 | 45.0 | Me:Zn, 15.0 | 1,160 | 7.61 | 1,033 | 60.8 | 2.5 |
| 43 | 40.0 | 45.0 | Me:Mg, 10.0, Me:Zn, 5.0. | 1,160 | 7.59 | 1,072 | 61.6 | 2.2 |
| 44 | 40.0 | 35.0 | Me:Mg, 25.0 | 1,120 | 7.53 | 1,214 | 54.3 | 3.0 |
| 45 | 40.0 | 35.0 | Me:Zn, 25.0 | 1,120 | 7.55 | 1,183 | 55.4 | 2.9 |
| 46 | 40.0 | 25.0 | Me:Mg, 35.0 | 1,082 | 7.50 | 1,080 | 53.8 | 2.1 |
| 47 | 40.0 | 25.0 | Me:Zn, 35.0 | 1,080 | 7.52 | 1,059 | 52.9 | 1.4 |
| 48 | 40.0 | 15.0 | Me:Mg, 45.0 | 1,050 | 7.48 | 901 | 51.0 | 1.2 |
| 49 | 40.0 | 15.0 | Me:Zn, 45.0 | 1,050 | 7.50 | 917 | 50.8 | 1.0 |
| 50 | 35.0 | 55.0 | Me:Mg, 10.0 | 1,200 | 7.60 | 1,140 | 52.7 | 1.8 |
| 51 | 35.0 | 55.0 | Me:Zn, 10.0 | 1,200 | 7.58 | 1,200 | 53.1 | 2.0 |
| 52 | 35.0 | 45.0 | Me:Mg, 20.0 | 1,160 | 7.57 | 1,414 | 58.3 | 2.2 |
| 53 | 35.0 | 45.0 | Me:Zn, 20.0 | 1,160 | 7.55 | 1,394 | 57.5 | 2.4 |
| 54 | 35.0 | 35.0 | Me:Mg, 30.0 | 1,120 | 7.51 | 1,206 | 54.9 | 2.6 |
| 55 | 35.0 | 35.0 | Me:Zn, 30.0, Me:Mg, 15.0. | 1,120 | 7.52 | 1,191 | 55.0 | 2.3 |
| 56 | 35.0 | 35.0 | Me:Zn, 15.0 | 1,120 | 7.53 | 1,205 | 56.2 | 2.0 |
| 57 | 35.0 | 25.0 | Me:Mg, 40.0 | 1,060 | 7.50 | 1,084 | 52.7 | 1.4 |
| 58 | 35.0 | 25.0 | Me:Zn, 40.0 | 1,060 | 7.51 | 1,033 | 53.0 | 1.3 |
| 59 | 35.0 | 15.0 | Me:Mg, 50.0 | 1,020 | 7.46 | 918 | 50.1 | 1.0 |
| 60 | 35.0 | 15.0 | Me:Zn, 50.0 | 1,020 | 7.43 | 906 | 50.0 | 0.9 |
| Reference: | | | | | | | | |
| 6 | 34.0 | 14.0 | Me:Mg, 52.0 | 1,000 | 7.40 | 881 | 47.4 | 5.6 |
| 7 | 34.0 | 14.0 | Me:Zn, 52.0 | 1,000 | 7.39 | 876 | 46.8 | 6.0 |

When determination was made of change with temperature in the dielectric constant of Example 13 (Curie point 345° C.) and Example 31 (Curie point 320° C.), there was observed the tendency of FIG. 4, in which the curve (e) represents Example 13 and the curve (f) Example 31. Further, when determination was made of change with temperature in the electro-mechanical coupling coefficient $K_{33}$ of said both Examples 13 and 31, there was shown the tendency of FIG. 3. Since said Examples 13 and 31 had a high Curie point, they indicated little change in the electro-mechanical coupling coefficient over a temperature range of 100° C. to 200° C., enabling said coefficient $K_{33}$ to be utilized at a fully high level under stable condition. Referring to FIG. 5, the curve (g) relates to Example 13 and the curve (h) Example 31.

There were prepared piezoelectric ignition units from materials having the same composition as Examples 19, 43 and 52. When determination was made of the voltage generated by said units, there was indicated the tendency of Table 2 which also gives the results of a test conducted on a piezoelectric ignition unit prepared from the prior art piezoelectric material (represented by the reference sample α) having a composition of $$Pb(Ti_{0.47}Zr_{0.53})O_3+1.0 \text{ wt. percent } Nb_2O_5$$

TABLE 2

| Sample | Number of impingements, time— | | | | | |
|---|---|---|---|---|---|---|
| | 1st | 1,000th | 10 thousandth | 100 thousandth | 1 millionth | Deterioration |
| Example: | | | | | | |
| 19 | 15.8 | 15.7 | 15.5 | 15.3 | 15.1 | 4.4 |
| 43 | 15.3 | 15.2 | 15.2 | 15.0 | 14.8 | 3.3 |
| 52 | 15.0 | 15.0 | 14.9 | 14.7 | 14.6 | 2.7 |
| Reference α | 15.5 | 15.0 | 14.3 | 13.7 | 13.0 | 15.6 |

Table 2 above shows that the oxide piezoelectric materials of this invention had excellent properties.

There was further conducted a pressure deterioration test to determine the loss of the electro-mechanical coupling coefficient $K_{33}$ by repeatedly applying a pressure of 1 ton/cm.², the results being presented in FIG. 6. The test shows that Examples 4, 25 and 47 indicated deterioration of less than 10%, whereas the reference prior art sample $\beta$ having a composition of $Pb(Ti_{0.46}Zr_{0.54})O_3$+0.7 wt. percent $Nb_2O_5$ and a similar reference sample $\gamma$ having a composition of $Pb(Ti_{0.47}Zr_{0.53})O_3$+0.8 wt. percent $La_2O_3$ presented a major deterioration of many percent. Referring to FIG. 6, the curve (j) represents Example 25, the curve (k) Example 47, the curve (l) the referential sample $\beta$ and the curve (m) the referential sample $\gamma$.

As is apparent from the foregoing examples, the piezoelectric material of this invention has excellent piezoelectric properties, is minimally subject to change therein as confirmed by the temperature and durability or pressure tests. It exhibits excellent performance characteristics, so that it can be deemed to have many industrial advantages.

What we claim is:

1. A piezoelectric material having a composition of 0.5 to 50.0 mol percent $Pb(Me_{1/2}Te_{1/2})O_3$, where Me represents at least one metal selected from the group consisting of magnesium and zinc, 35.0 to 57.0 mol percent $PbTiO_3$ and 15.0 to 55.0 mol percent $PbZrO_3$ wherein the sum of $Pb(Me_{1/2}Te_{1/2})O_3$, $PbTiO_3$ and $PbZrO_3$ equals 100 mol percent.

References Cited

UNITED STATES PATENTS

| | | | |
|---|---|---|---|
| 3,268,453 | 8/1966 | Ouchi et al. | 252—62.9 |
| 3,309,168 | 3/1967 | Bayer | 252—62.9 X |
| 3,463,732 | 8/1969 | Banno et al. | 252—62.9 |

OTHER REFERENCES

Bayer: "Journal of the American Ceramic Society," vol. 46, No. 12, December 1963, pp. 604–5.

TOBIAS E. LEVOW, Primary Examiner

J. COOPER, Assistant Examiner

U.S. Cl. X.R.

106—39 R